United States Patent
Ogawa et al.

(10) Patent No.: US 12,317,563 B2
(45) Date of Patent: May 27, 2025

(54) NITRIDE SEMICONDUCTOR DEVICE

(71) Applicant: Panasonic Holdings Corporation, Osaka (JP)

(72) Inventors: Masahiro Ogawa, Osaka (JP); Daisuke Shibata, Kyoto (JP); Satoshi Tamura, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 423 days.

(21) Appl. No.: 17/789,682

(22) PCT Filed: Dec. 21, 2020

(86) PCT No.: PCT/JP2020/047685
§ 371 (c)(1),
(2) Date: Jun. 28, 2022

(87) PCT Pub. No.: WO2021/140898
PCT Pub. Date: Jul. 15, 2021

(65) Prior Publication Data
US 2023/0047842 A1 Feb. 16, 2023

(30) Foreign Application Priority Data
Jan. 8, 2020 (JP) .................................. 2020-001752

(51) Int. Cl.
*H01L 29/20* (2006.01)
*H10D 30/01* (2025.01)
(Continued)

(52) U.S. Cl.
CPC ....... *H10D 62/8503* (2025.01); *H10D 30/051* (2025.01); *H10D 30/061* (2025.01);
(Continued)

(58) Field of Classification Search
CPC .......... H01L 29/2003; H01L 29/66848; H01L 29/66893; H01L 29/778; H01L 29/808;
(Continued)

(56) References Cited

U.S. PATENT DOCUMENTS

2012/0181548 A1  7/2012  Okada et al.
2018/0350917 A1* 12/2018  Ujita ................. H01L 29/42356
(Continued)

FOREIGN PATENT DOCUMENTS

JP  2011-082397 A   4/2011
JP  5353735 B2      8/2011
TW  2020/137303 A1  7/2020

OTHER PUBLICATIONS

International Search Report issued on Mar. 16, 2021 in International Patent Application No. PCT/JP2020/047685, with English translation.

*Primary Examiner* — Victor A Mandala
*Assistant Examiner* — Colleen E Snow
(74) *Attorney, Agent, or Firm* — Rimon P.C.

(57) ABSTRACT

A nitride semiconductor device includes a substrate, a first electron transport layer above the substrate, a first electron supply layer above the first electron transport layer, a first nitride semiconductor layer above the first electron supply layer, a first opening passing through the first nitride semiconductor layer and the first electron supply layer and reaching the first electron transport layer, a second electron transport layer disposed above the first nitride semiconductor layer and along the inner surface of the first opening, a second electron supply layer disposed above the second electron transport layer and covering the first opening, a gate electrode disposed above the second electron supply layer and covering the first opening, a source electrode connected
(Continued)

to the first nitride semiconductor layer and the second electron transport layer, and a drain electrode.

9 Claims, 10 Drawing Sheets

(51) Int. Cl.
*H10D 30/47* (2025.01)
*H10D 30/83* (2025.01)
*H10D 30/87* (2025.01)
*H10D 62/83* (2025.01)
*H10D 62/85* (2025.01)

(52) U.S. Cl.
CPC ............. *H10D 30/47* (2025.01); *H10D 30/83* (2025.01); *H10D 30/87* (2025.01); *H10D 62/83* (2025.01)

(58) Field of Classification Search
CPC .. H01L 29/812; H10D 62/8503; H10D 30/47; H10D 30/87; H10D 30/051; H10D 30/83; H10D 62/83; H10D 30/061
See application file for complete search history.

(56) References Cited

U.S. PATENT DOCUMENTS

| 2020/0312964 A1* | 10/2020 | Shibata | ............... H01L 29/2003 |
| 2020/0411679 A1* | 12/2020 | Ogawa | ................ H01L 29/7789 |
| 2022/0059660 A1 | 2/2022 | Shibata et al. | |

* cited by examiner

NITRIDE SEMICONDUCTOR DEVICE

CROSS-REFERENCE OF RELATED APPLICATIONS

This application is the U.S. National Phase under 35 U.S.C. § 371 of International Patent Application No. PCT/JP2020/047685, filed on Dec. 21, 2020, which in turn claims the benefit of Japanese Patent Application No. 2020-001752, filed on Jan. 8, 2020, the entire disclosures of which Applications are incorporated by reference herein.

TECHNICAL FIELD

The present disclosure relates to a nitride semiconductor device.

BACKGROUND ART

Nitride semiconductors, such as gallium nitride (GaN), are wide-gap semiconductors having large band gaps and have the features of high breakdown fields and the saturated drift velocities of electrons higher than those of, for example, gallium arsenide (GaAs) semiconductors or silicon (Si) semiconductors. Thus, power transistors including nitride semiconductors suitable to achieve higher output and dielectric strength are currently under research and development.

For instance, Patent Literature 1 (PTL 1) discloses a semiconductor device formed using a GaN-based layered structure. The semiconductor device disclosed in PTL 1 is a vertical field effect transistor (FET) including a regrowth layer covering an opening formed in the GaN-based layered structure and a gate electrode formed along and on the regrowth layer. Two-dimensional electron gas (2DEG) generated in the regrowth layer forms a channel, which enables the FET to have high electron mobility and low on-resistance.

CITATION LIST

Patent Literature

[PTL 1] Japanese Unexamined Patent Application Publication No. 2011-82397

SUMMARY OF INVENTION

Technical Problem

However, in the field effect transistor disclosed in PTL 1, a current flows only vertically directly below the opening and does not spread horizontally. Thus, the resistance value of the field effect transistor during operation is high, which is considered an issue.

In view of the foregoing, the present disclosure provides nitride semiconductor devices in which resistance values during operation can be decreased.

Solution to Problem

To address the above issue, a nitride semiconductor device according to one aspect of the present disclosure includes a substrate having a first main surface and a second main surface opposite to the first main surface, a first electron transport layer disposed above the first main surface and having a first conductivity type, a first electron supply layer above the first electron transport layer, a first nitride semiconductor layer disposed above the first electron supply layer and having a second conductivity type different from the first conductivity type, a first opening passing through the first nitride semiconductor layer and the first electron supply layer and reaching the first electron transport layer, a second electron transport layer disposed above the first nitride semiconductor layer and along the inner surface of the first opening, a second electron supply layer disposed above the second electron transport layer and covering the first opening, a gate electrode disposed above the second electron supply layer and covering the first opening, a source electrode connected to the first nitride semiconductor layer and the second electron transport layer, and a drain electrode on the second-main-surface side of the substrate.

In addition, a nitride semiconductor device according to another aspect of the present disclosure includes a substrate having a first main surface and a second main surface opposite to the first main surface, a first electron transport layer disposed above the first main surface and having a first conductivity type, a first nitride semiconductor layer disposed above the first electron transport layer and having a second conductivity type different from the first conductivity type, a first opening passing through the first nitride semiconductor layer and reaching the first electron transport layer, a second electron transport layer disposed above the first nitride semiconductor layer and along the inner surface of the first opening, an electron supply layer disposed above the second electron transport layer and covering the first opening, a gate electrode disposed above the electron supply layer and covering the first opening, a source electrode connected to the first nitride semiconductor layer and the second electron transport layer, and a drain electrode on the second-main-surface-side of the substrate. The first electron transport layer includes a third nitride semiconductor layer having the first conductivity type and a fourth nitride semiconductor layer positioned between the third nitride semiconductor layer and the first nitride semiconductor layer and having an impurity concentration higher than the impurity concentration of the third nitride semiconductor layer.

Advantageous Effects of Invention

In the nitride semiconductor devices according to the present disclosure, resistance values during operation can be decreased.

Figure 1:
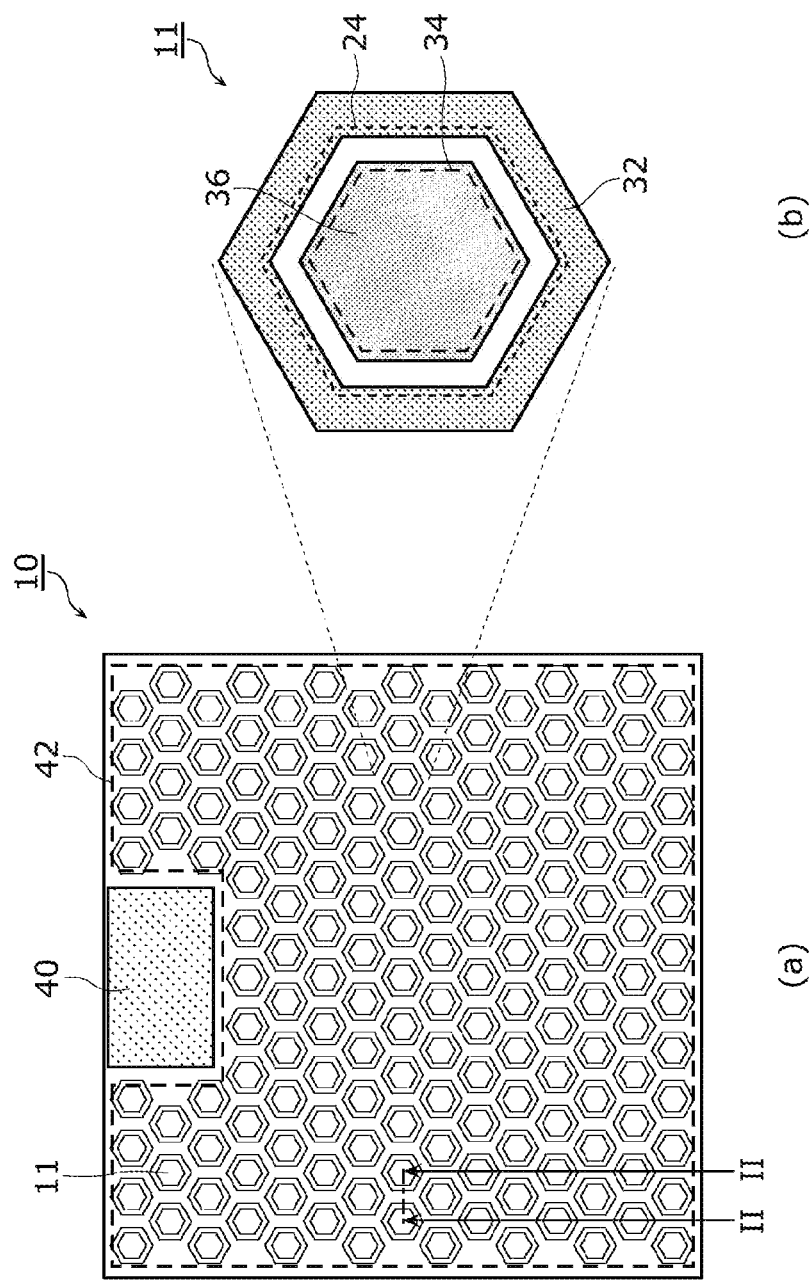
FIG. 1 is a plan view illustrating a plan layout of a nitride semiconductor device according to Embodiment 1.

DESCRIPTION OF EMBODIMENTS (Overview of Present Disclosure)

To address the above issue, a nitride semiconductor device according to one aspect of the present disclosure includes a substrate having a first main surface and a second main surface opposite to the first main surface, a first electron transport layer disposed above the first main surface and having a first conductivity type, a first electron supply layer above the first electron transport layer, a first nitride semiconductor layer disposed above the first electron supply layer and having a second conductivity type different from the first conductivity type, a first opening passing through the first nitride semiconductor layer and the first electron supply layer and reaching the first electron transport layer, a second electron transport layer disposed above the first nitride semiconductor layer and along the inner surface of the first opening, a second electron supply layer disposed above the second electron transport layer and covering the first opening, a gate electrode disposed above the second electron supply layer and covering the first opening, a source electrode connected to the first nitride semiconductor layer and the second electron transport layer, and a drain electrode on the second-main-surface-side of the substrate.

Thus, two-dimensional electron gas generated in the first electron transport layer forms a channel, which enables a current between the source and drain electrodes flowing through the opening to flow along the channel and spread horizontally within the first electron transport layer. That is, it is possible to widen a current path within the first electron transport layer, which facilitates a current flow between the source and drain electrodes. Thus, in the above aspect, it is possible to provide the nitride semiconductor device in which the resistance value during operation can be decreased.

For instance, the nitride semiconductor device according to the aspect may further include a high-resistance layer disposed along a portion of the inner surface of the first opening, between the first nitride semiconductor layer and the second electron transport layer, including a nitride semiconductor, and having a resistance higher than the resistance of the first nitride semiconductor layer.

Thus, the high-resistance layer is formed between the first nitride semiconductor layer and the second electron transport layer. The high-resistance layer suppresses a leakage current from flowing from the source electrode to the gate electrode through the first nitride semiconductor layer and the second electron transport layer. For instance, by the high-resistance layer serving as an insulation layer, a leakage current path is virtually blocked, and thus a leakage current can be sufficiently decreased.

For instance, the high-resistance layer may include iron.

Thus, inclusion of iron in the nitride semiconductor enables the high-resistance layer to have a high resistance, which can further decrease the leakage current. In addition, the high-resistance layer can be readily formed into a desired shape in a desired region by, for example, ion implantation. For instance, for ion implantation, the nitride semiconductor of a portion into which iron ions have been implanted can be readily brought into an amorphous state, which enables the portion to have a high resistance. For ion implantation, for example, the resistance value and shape of the high-resistance layer can be accurately adjusted, which can improve the reliability of the suppression effects of the leakage current.

For instance, the high-resistance layer may be disposed along a portion of the inner surface of the first opening, between the first electron supply layer and the second electron transport layer.

Thus, the high-resistance layer covers not only a portion of the first nitride semiconductor layer exposed to the first opening but also a portion of the first electron supply layer exposed to the first opening. This enables the high-resistance layer to certainly cover an end portion of the first nitride semiconductor layer, which can further improve the reliability of the suppression effects of the leakage current.

In addition, the first opening may have a bottom and a side wall, and the high-resistance layer may be provided along at least a portion of the side wall and a portion of the bottom.

Since the high-resistance layer is provided along at least a portion of the side wall and a portion of the bottom of the inner surface of the first opening, it is possible to suppress the concentration of the electric field on the boundary between the side wall and the bottom. Suppression of the electric-field concentration can increase the dielectric strength of the nitride semiconductor device.

For instance, the nitride semiconductor device according to the aspect may further include a second nitride semiconductor layer disposed between the gate electrode and the second electron supply layer and having the second conductivity type.

Because of the second nitride semiconductor layer, a carrier concentration directly below the gate electrode can be decreased, which can shift the threshold voltage of the nitride semiconductor device to the positive side. This enables the nitride semiconductor device according to the aspect to operate as a normally-off FET.

For instance, when the substrate is seen in plan view, the end of the gate electrode may be closer to the source electrode than the end of the first opening is.

This can improve controllability for a channel formed in a regrowth layer.

For instance, the nitride semiconductor device according to the aspect may further include a second opening positioned apart from the gate electrode, passing through the second electron transport layer, and reaching the first nitride semiconductor layer. At least a portion of the source electrode may be inside the second opening.

Thus, application of a voltage between the source and drain electrodes can form a depletion layer near the interface between the second nitride semiconductor layer and the first nitride semiconductor layer. The formed depletion layer can suppress the occurrence of a leakage current between the source and drain electrodes, which can increase the dielectric strength of the nitride semiconductor device.

For instance, the first electron transport layer may include a third nitride semiconductor layer having the first conductivity type and a fourth nitride semiconductor layer that is undoped and positioned between the third nitride semiconductor layer and the first electron supply layer.

Since two-dimensional electron gas generated in the fourth nitride semiconductor layer forms a channel, a current between the source and drain electrodes flowing through the opening flows along the channel and spreads horizontally within the fourth nitride semiconductor layer. That is, it is possible to widen a current path within the first electron transport layer, which facilitates a current flow between the source and drain electrodes. Accordingly, in the aspect, it is possible to provide the nitride semiconductor device in which the resistance value during operation can be decreased. In addition, since the fourth nitride semiconductor layer is an undoped nitride semiconductor layer and has few impurities, it is possible to increase the electron mobility.

For instance, a nitride semiconductor device according to another aspect of the present disclosure includes a substrate having a first main surface and a second main surface opposite to the first main surface, a first electron transport layer disposed above the first main surface and having a first conductivity type, a first nitride semiconductor layer disposed above the first electron transport layer and having a second conductivity type different from the first conductivity type, a first opening passing through the first nitride semiconductor layer and reaching the first electron transport layer, a second electron transport layer disposed above the first nitride semiconductor layer and along the inner surface of the first opening, an electron supply layer disposed above the second electron transport layer and covering the first opening, a gate electrode disposed above the electron supply layer and covering the first opening, a source electrode connected to the first nitride semiconductor layer and the second electron transport layer, and a drain electrode on the second-main-surface-side of the substrate. The first electron transport layer includes a third nitride semiconductor layer having the first conductivity type and a fourth nitride semiconductor layer positioned between the third nitride semiconductor layer and the first nitride semiconductor layer and having an impurity concentration higher than the impurity concentration of the third nitride semiconductor layer.

Since two-dimensional electron gas generated in the fourth nitride semiconductor layer having a high impurity concentration forms a channel, a current between the source and drain electrodes flowing through the opening flows along the channel and spreads horizontally within the fourth nitride semiconductor layer. Thus, it is possible to widen a current path within the first electron transport layer, which facilitates a current flow between the source and drain electrodes. In addition, since the fourth nitride semiconductor layer has a high impurity concentration and a low resistance, it is possible to further facilitate the spread of the current. Accordingly, in the aspect, it is possible to provide the nitride semiconductor device in which the resistance value during operation can be decreased.

Hereinafter, embodiments are described in detail with reference to the drawings.

It should be noted that the embodiments described below each show general or specific examples. The numerical values, shapes, materials, structural elements, positions and connections of the structural elements, steps, order of the steps, and other details described in the embodiments below are mere examples and are not intended to limit the present disclosure. In addition, among the structural elements described in the embodiments below, the structural elements not included in the independent claims are described as optional structural elements.

In addition, the drawings are schematic views and are not necessarily precisely drawn. Thus, for instance, the scales in the drawings are not necessarily identical. In addition, in the drawings, substantially identical elements are assigned the same reference symbol, and overlapping explanations are omitted or simplified.

In addition, in the specification, a term describing a relationship between elements, such as parallel or identical, a term describing the shape of an element, such as a rectangular or a trapezoid, and a numerical value range are not limited to the strict sense of terms and also include a substantially equivalent range like a difference of around some percentages.

In addition, in the specification, the terms above and below do not indicate upward (vertically upward) or downward (vertically downward) in absolute spatial recognition and are used as terms defined by a relative positional relationship based on the layering order in a layered structure. In addition, the terms above and below are used not only in cases where two structural elements are apart from each other with another structural element present therebetween but also in cases where two structural elements adhere to each other and are in contact with each other.

Embodiment 1

[Configuration]

A configuration of a nitride semiconductor device according to Embodiment 1 is described with reference to FIGS. 1 and 2.

FIG. 1 is a plan view illustrating a plan layout of nitride semiconductor device 10 according to Embodiment 1. FIG. 2 is a cross-sectional view of nitride semiconductor device 10 according to Embodiment 1.

Here, (a) in FIG. 1 is a plan view in which nitride semiconductor device 10 is viewed from above. (b) in FIG. 1 is an enlarged view of unit cell 11 of nitride semiconductor device 10. FIG. 2 illustrates a cross section of nitride semiconductor device 10 according to Embodiment 1 taken along the line II-II in FIG. 1.

As illustrated in (a) in FIG. 1, nitride semiconductor device 10 includes unit cells 11. Unit cells 11 are formed in a two-dimensional arrangement. Unit cells 11 have the same configuration. The plan-view shape of unit cell 11 is a hexagon. Unit cells 11 are arranged so that in plan view, the centers of unit cells 11 are located at the respective vertices of regular triangles arranged in a filling manner.

Unit cell 11 centers on source electrode 36. FIG. 2 illustrates a cross section of nitride semiconductor device 10 taken along the line II-II passing through the centers of two adjacent pixel cells 11.

Figure 2:
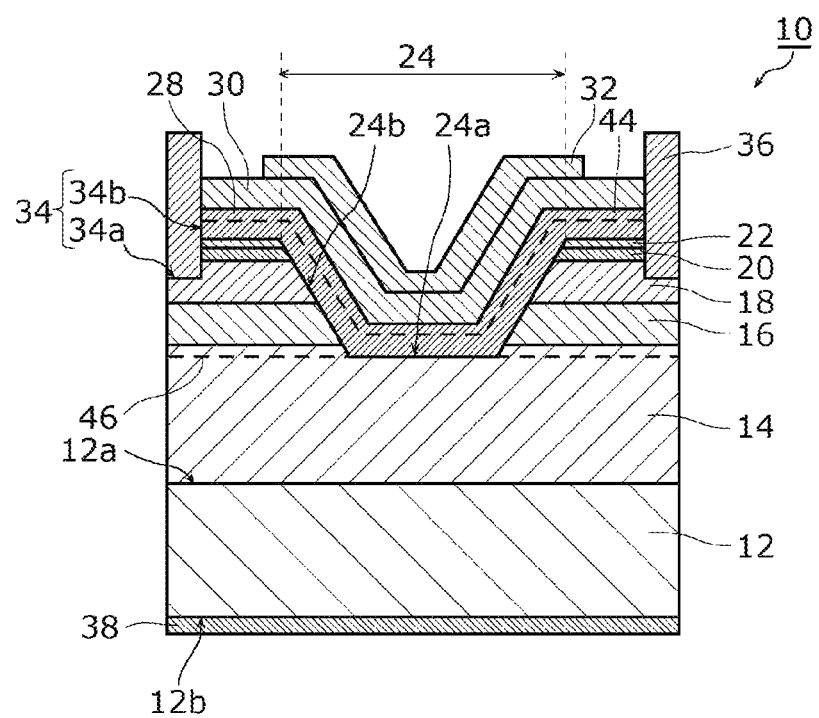
FIG. 2 is a cross-sectional view of the nitride semiconductor device according to Embodiment 1.

As illustrated in FIG. 2, nitride semiconductor device 10 includes substrate 12, drift layer 14, first underlayer 16, second underlayer 18, third underlayer 20, fourth underlayer 22, gate opening 24, electron transport layer 28, electron supply layer 30, gate electrode 32, source opening 34, source electrode 36, and drain electrode 38. Furthermore, as illustrated in (a) in FIG. 1, nitride semiconductor device 10 includes gate electrode pad 40 and source electrode pad 42. It should be noted that in (a) in FIG. 1, the schematic outline of source electrode pad 42 is illustrated by a dashed line.

Nitride semiconductor device 10 has a layered structure of semiconductor layers including nitride semiconductors, such as GaN and AlGaN, as main constituents. Specifically, nitride semiconductor device 10 has the heterostructure of an AlGaN film and a GaN film.

In the heterostructure of the AlGaN film and the GaN film, spontaneous polarization or piezoelectric polarization on a c-plane referred to as a plane (0001) generates high-concentration two-dimensional electron gas (2DEG) on the heterointerface. Thus, even in an undoped state, a sheet carrier concentration higher than or equal to $1 \times 10^{13}$ cm$^{-2}$ is obtained on the heterointerface.

Nitride semiconductor device 10 includes heterostructures. Specifically, the layered structure of drift layer 14 and first underlayer 16 and the layered structure of electron transport layer 28 and electron supply layer 30 form the heterostructures. In drift layer 14, two-dimensional electron gas 46 is generated near the interface between drift layer 14 and first underlayer 16. In electron transport layer 28, two-dimensional electron gas 44 is generated near the interface between electron transport layer 28 and electron supply layer 30. Nitride semiconductor device 10 according to Embodiment 1 is a field effect transistor (FET) using, as a channel, two-dimensional electron gas 44 generated in electron transport layer 28. Specifically, nitride semiconductor device 10 is a vertical FET. It should be noted that in FIG. 2, two-dimensional electron gas 44 and two-dimensional electron gas 46 are schematically illustrated by dashed lines.

Substrate 12 is a nitride semiconductor substrate and has first main surface 12a and second main surface 12b opposite to each other as illustrated in FIG. 2. First main surface 12a is the main surface near drift layer 14. Specifically, first main surface 12a is approximately identical to the c-plane. Second main surface 12b is opposite to first main surface 12a and is the main surface near drain electrode 38. Examples of the plan-view shape of substrate 12 include, but are not limited to, a rectangle.

For instance, substrate 12 is an n-type GaN substrate having a thickness of 300 μm and a carrier concentration of $1 \times 10^{18}$ cm$^{-3}$. It should be noted that the n-type and p-type are the semiconductor conductivity types. In Embodiment 1, the n-type is an example of a first conductivity type of nitride semiconductors. The p-type is an example of a second conductivity type whose polarization differs from that of the first conductivity type.

It should be noted that substrate 12 does not have to be a nitride semiconductor substrate. Substrate 12 may be, for example, a silicon (Si) substrate, a silicon carbide (SiC) substrate, or zinc oxide (ZnO) substrate.

Drift layer 14 is an example of a first electron transport layer formed above first main surface 12a of substrate 12 and having the first conductivity type. Drift layer 14 is made of a nitride semiconductor having the first conductivity type. For instance, drift layer 14 is an n-type GaN film having a thickness of 8 μm and a carrier concentration of $1 \times 10^{16}$ cm$^{-3}$. Drift layer 14 is in contact with first main surface 12a of substrate 12.

First underlayer 16 is an example of a first electron supply layer above drift layer 14. First underlayer 16 is made of a nitride semiconductor. For instance, first underlayer 16 is an undoped $Al_{0.2}Ga_{0.8}N$ film having a thickness of 50 nm. An AlGaN/GaN heterointerface is formed between first underlayer 16 and drift layer 14. Thus, two-dimensional electron gas 46 is generated in drift layer 14.

Second underlayer 18 is an example of a first nitride semiconductor layer formed above first underlayer 16 and having the second conductivity type different from the first conductivity type. For instance, second underlayer 18 is a p-type GaN film having a thickness of 400 nm and a carrier concentration of $1 \times 10^{17}$ cm$^{-3}$. Second underlayer 18 is in contact with the top surface of first underlayer 16.

Second underlayer 18 suppresses a leakage current between source electrode 36 and drain electrode 38. When for instance a reverse voltage is applied to a p-n junction formed by second underlayer 18 and drift layer 14, that is, when the potential of drain electrode 38 is higher than that of source electrode 36, a depletion layer expands in drift layer 14. This enables nitride semiconductor device 10 to have high dielectric strength.

Third underlayer 20 is above second underlayer 18. Third underlayer 20 is made of an insulating or semi-insulating nitride semiconductor. For instance, third underlayer 20 is an undoped GaN film having a thickness of 200 nm. Third underlayer 20 is in contact with second underlayer 18.

It should be noted that the expression undoped used herein means that the layer is not doped with a dopant, such as silicon (Si) or magnesium (Mg), that changes the polarity of GaN to the n-type or the p-type. In Embodiment 1, third underlayer 20 is doped with carbon. Specifically, third underlayer 20 has a higher carbon concentration than second underlayer 18.

In addition, third underlayer 20 may include silicon (Si) or oxygen (O) that has been mixed into third underlayer 20 when forming the film. In this case, the carbon concentration of third underlayer 20 is, for example, higher than or equal to $3 \times 10^{17}$ cm$^{-3}$ and may be higher than or equal to $1 \times 10^{18}$ cm$^{-3}$. The silicon concentration or the oxygen concentration of third underlayer 20 is, for example, lower than or equal to $5 \times 10^{16}$ cm$^{-3}$ and may be lower than or equal to $2 \times 10^{16}$ cm$^{-3}$.

Here, if nitride semiconductor device 10 does not include third underlayer 20, a layered structure including: n-type electron supply layer 30 and electron transport layer 28; p-type second underlayer 18; and n-type first underlayer 16 and n-type drift layer 14 is formed between source electrode 36 and drain electrode 38. The layered structure functions as a parasitic bipolar transistor having a parasitic NPN structure.

During the off-state of nitride semiconductor device 10, when a current flows through second underlayer 18, the parasitic bipolar transistor may be switched on, which may decrease the dielectric strength of nitride semiconductor device 10. In this case, nitride semiconductor device 10 is likely to experience a malfunction.

Third underlayer 20 suppresses the creation of the parasitic NPN structure. Thus, it is possible to decrease malfunctions of nitride semiconductor device 10 due to the creation of the parasitic NPN structure. It should be noted that if a current flowing through second underlayer 18 is sufficiently suppressed, nitride semiconductor device 10 does not to have to include third underlayer 20.

Fourth underlayer 22 is above third underlayer 20. For instance, fourth underlayer 22 is an $Al_{0.2}Ga_{0.8}N$ film having a thickness of 20 nm. Fourth underlayer 22 is in contact with third underlayer 20.

Fourth underlayer 22 suppresses a p-type impurity, such as Mg, from spreading from second underlayer 18. If Mg spreads into the channel in electron transport layer 28, the carrier concentration of two-dimensional electron gas 44 may decrease, which may increase the on-resistance. It should be noted that the spread degree of Mg differs depending on, for example, epitaxial growth conditions, too. Thus, if the spread of Mg is suppressed, nitride semiconductor device 10 does not have to include fourth underlayer 22.

In addition, fourth underlayer 22 may have the function of supplying electrons to the channel formed on and near the interface between electron transport layer 28 and electron supply layer 30. For instance, fourth underlayer 22 has a larger band gap than electron supply layer 30.

Gate opening 24 is an example of a first opening passing through first underlayer 16 and reaching drift layer 14. Specifically, gate opening 24 extends from the top surface of fourth underlayer 22, sequentially passes through fourth underlayer 22, third underlayer 20, second underlayer 18, and first underlayer 16, and reaches drift layer 14. Bottom 24a of gate opening 24 forms a portion of the top surface of drift layer 14. In Embodiment 1, as illustrated in FIG. 2, bottom 24a of gate opening 24 is below the interface between drift layer 14 and first underlayer 16.

In Embodiment 1, the opening area of gate opening 24 increases in the direction opposite to the direction toward substrate 12. Specifically, side wall 24b of gate opening 24 is inclined. The cross-sectional shape of gate opening 24 is, for example, an inverted trapezoid, more specifically, an inverted isosceles trapezoid. It should be noted that in (b) in FIG. 1, the outline of the top end of gate opening 24 is illustrated by a dashed line. The outline of bottom 24a of gate opening 24 is slightly smaller than the outer perimeter of gate electrode 32 illustrated in (b) in FIG. 1.

Electron transport layer 28 is an example of a second electron transport layer formed above second underlayer 18 and along the inner surface of gate opening 24. Electron transport layer 28 is a first regrowth layer formed by regrowing a nitride semiconductor after gate opening 24 is formed. Specifically, electron transport layer 28 having an approximately uniform thickness is formed along the top surface of fourth underlayer 22 and side wall 24b and bottom 24a of gate opening 24. For instance, electron transport layer 28 is an undoped GaN film having a thickness of 100 nm.

Electron transport layer 28 is in contact with drift layer 14 at bottom 24a of gate opening 24. Electron transport layer 28 is in contact with the side surfaces of first underlayer 16, second underlayer 18, third underlayer 20, and fourth underlayer 22 along side wall 24b of gate opening 24. Furthermore, electron transport layer 28 is in contact with the top surface of fourth underlayer 22.

Electron transport layer 28 has a channel. Specifically, two-dimensional electron gas 44 is generated near the interface between electron transport layer 28 and electron supply layer 30. Two-dimensional electron gas 44 functions as the channel of electron transport layer 28. Although electron transport layer 28 is undoped, electron transport layer 28 may be doped with, for example, Si to cause electron transport layer 28 to have the n-type.

In addition, although not illustrated in the figures, in Embodiment 1, as a second regrowth layer, an AlN film having a thickness of around 1 nm is formed between electron transport layer 28 and electron supply layer 30. The AlN film can suppress alloy scattering and improve the channel mobility. It should be noted that the AlN film does not have to be formed, and electron transport layer 28 and electron supply layer 30 may be directly in contact with each other.

Electron supply layer 30 is an example of a second electron supply layer formed above second underlayer 18 and along the inner surface of gate opening 24. Electron supply layer 30 is a third regrowth layer formed by regrowing a nitride semiconductor after gate opening 24 is formed. It should be noted that electron transport layer 28 and electron supply layer 30 are sequentially formed from the side on which substrate 12 is formed. Electron supply layer 30 having an approximately uniform thickness is formed along the top surface of electron transport layer 28. For instance, electron supply layer 30 is an undoped $Al_{0.2}Ga_{0.8}N$ film having a thickness of 50 nm.

For instance, an AlGaN/GaN heterointerface is formed between electron supply layer 30 and electron transport layer 28. Here, the 1-nm-thick AlN film is interposed between electron supply layer 30 and electron transport layer 28. Thus, two-dimensional electron gas 44 is generated in electron transport layer 28.

Electron supply layer 30 supplies electrons to the channel (that is, two-dimensional electron gas 44) formed in electron transport layer 28. It should be noted that as described above, in Embodiment 1, fourth underlayer 22 also has the function of supplying electrons. Although each of electron supply layer 30 and fourth underlayer 22 is made of AlGaN, the Al composition ratio of each layer is not limited to a particular Al composition ratio. For instance, the Al composition ratio of electron supply layer 30 may be 20%, and the Al composition ratio of fourth underlayer 22 may be 25%.

Gate electrode 32 is above electron supply layer 30 and covers gate opening 24. In Embodiment 1, gate electrode 32 having an approximately uniform thickness is formed along and on the top surface of electron supply layer 30.

Gate electrode 32 includes a conductive material such as a metal. For instance, gate electrode 32 includes palladium (Pd). It should be noted that as a material of gate electrode 32, a material that can make Schottky contact with an n-type semiconductor can be used. For instance, a nickel (Ni)-based material, tungsten silicide (WSi), gold (Au), or other material can be used.

In plan view, gate electrode 32 is spaced apart from source electrode 36 so as not to be in contact with source electrode 36. Specifically, as illustrated in (b) in FIG. 1, in plan view, gate electrode 32 surrounds source electrode 36. More specifically, gate electrode 32 is formed into the shape of a plate having openings corresponding to hexagonal source electrodes 36.

In Embodiment 1, in plan view, the end of gate electrode 32 is closer to source electrode 36 than the end of gate opening 24 is. Specifically, in plan view, gate opening 24 is inside gate electrode 32. That is, in plan view, gate electrode 32 entirely covers gate opening 24.

Source opening 34 is an example of a second opening that is apart from gate electrode 32, passes through electron transport layer 28, and reaches second underlayer 18. Specifically, source opening 34 sequentially passes through electron supply layer 30, electron transport layer 28, fourth underlayer 22, and third underlayer 20 and reaches second underlayer 18. In Embodiment 1, as illustrated in FIG. 2, bottom 34a of source opening 34 forms a portion of the top surface of second underlayer 18. Bottom 34a is below the interface between second underlayer 18 and third underlayer 20. In plan view, source opening 34 is apart from gate opening 24.

As illustrated in FIG. 2, the opening area of source opening 34 is approximately uniform. Specifically, side wall 34b of source opening 34 is approximately parallel to a thickness direction of substrate 12. For instance, the cross-sectional shape of source opening 34 is a rectangle. Alternatively, the cross-sectional shape of source opening 34 may be an inverted trapezoid as with that of gate opening 24.

In Embodiment 1, as illustrated in (b) in FIG. 1, the opening shape or plan-view shape of source opening 34 is a regular hexagon. The distance between source opening 34 and gate electrode 32 surrounding the perimeter of source opening 34 is approximately constant. Side wall 34b of source opening 34 has a plane (1-100). Here, the plane (1-100) encompasses the plane (1-100) and planes equivalent to the plane (1-100).

Source electrode 36 is formed in source opening 34. Specifically, source electrode 36 fills source opening 34.

Source electrode 36 is connected to second underlayer 18. Specifically, source electrode 36 is connected to the end faces of electron supply layer 30, electron transport layer 28, fourth underlayer 22, and third underlayer 20. Source electrode 36 is in ohmic contact with electron transport layer 28 and electron supply layer 30.

Source electrode 36 includes conductive materials such as metals. Materials, such as Ti/Al, that can make ohmic contact with an n-type semiconductor layer can be used as the materials of source electrode 36.

Since source electrode 36 is connected to third underlayer 20, it is possible to fix the potential of third underlayer 20, which can stabilize operation of nitride semiconductor device 10.

In addition, Al makes Schottky contact with second underlayer 18 made of a p-type nitride semiconductor. Thus, a lower portion of source electrode 36 may include a large-work-function metal material, such as Pd or Ni, that has a low contact resistance to the p-type nitride semiconductor. This can further stabilize the potential of second underlayer 18.

Drain electrode 38 is formed on the second-main-surface-12b side of substrate 12. Specifically, drain electrode 38 is in contact with second main surface 12b. Drain electrode 38 includes conductive materials such as metals. As with the materials of source electrode 36, materials, such as Ti/Al, that can make ohmic contact with an n-type semiconductor layer can be used as the materials of drain electrode 38.

Gate electrode pad 40 is electrically connected to gate electrode 32. For instance, gate electrode pad 40 is above gate electrode 32. In Embodiment 1, gate electrode 32 has a plate-like shape. Thus, as illustrated in (a) in FIG. 1, gate electrode pad 40 is formed only in a portion of nitride semiconductor device 10 in plan view. Gate electrode pad 40 is connected to a power supply for controlling gate electrode 32.

Source electrode pad 42 is electrically connected to source electrodes 36. Source electrode pad 42 is above source electrode 36. In Embodiment 1, source electrodes 36 are hexagonal-island-shaped. Thus, when nitride semiconductor device 10 is seen in plan view, source electrode pad 42 is formed in a major portion not including source electrode pad 42 and covers source electrodes 36.

As described above, nitride semiconductor device 10 according to Embodiment 1 has the AlGaN/GaN heterointerface between electron transport layer 28 and electron supply layer 30. Thus, two-dimensional electron gas 44 is generated in electron transport layer 28, which forms a channel. Two-dimensional electron gas 44 has a high carrier concentration, which leads to high channel mobility and a lower resistance value (lower on-resistance) during operation.

For nitride semiconductor device 10, in drift layer 14, two-dimensional electron gas 46 spreads horizontally (specifically, directions parallel to first main surface 12a of substrate 12) from the vicinity of bottom 24a of gate opening 24. Thus, electrons traveling through two-dimensional electron gas 44 in electron transport layer 28 are likely to pass through two-dimensional electron gas 46 near bottom 24a and spread horizontally. Thus, in drift layer 14, not only a portion directly below bottom 24a but also a portion outside the portion directly below bottom 24a (outside bottom 24a in plan view) can be used as current paths. Thus, the current between the source and drain electrodes is likely to spread in a large portion of drift layer 14. Accordingly, it is possible to decrease the resistance value during operation of nitride semiconductor device 10.

[Fabrication Method]

A method of fabricating nitride semiconductor device 10 according to Embodiment 1 is described with reference to FIGS. 3A to 3F. FIGS. 3A to 3F are cross-sectional views illustrating the processes of the method of fabricating nitride semiconductor device 10 according to Embodiment 1.

In the case described below, the nitride semiconductor layers of nitride semiconductor device 10 are formed by metal organic vapor phase epitaxy (MOVPE). It should be noted that the method of forming the nitride semiconductor layers is not limited to MOVPE. For instance, the nitride semiconductor layers may be formed by molecular beam epitaxy (MBE).

In addition, an n-type nitride semiconductor is formed by adding, for example, silicon (Si). A p-type nitride semiconductor is formed by adding magnesium (Mg). It should be noted that an n-type impurity and a p-type impurity are not limited to the above examples.

Figure 3A:
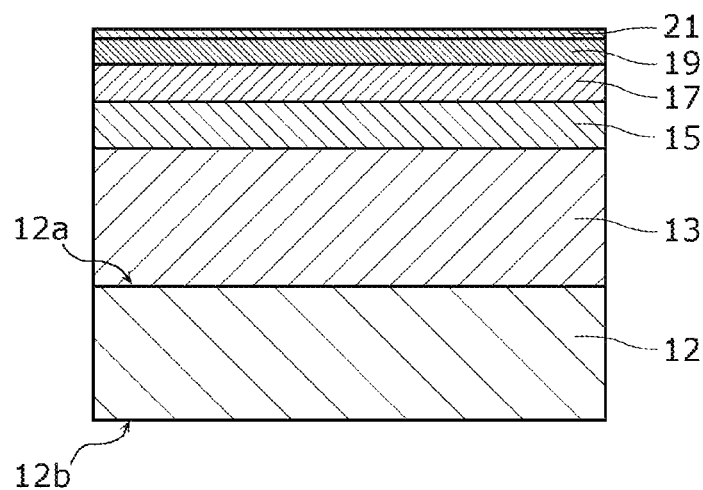
FIG. 3A is a cross-sectional view illustrating a process of stacking nitride semiconductor layers in the method of fabricating the nitride semiconductor device according to Embodiment 1.

First, n-type GaN substrate 12 in which first main surface 12a is the plane (0001), that is, the c-plane is prepared. As illustrated in FIG. 3A, n-type GaN film 13 including Si as an n-type impurity, undoped AlGaN film 15 made of undoped $Al_{0.2}Ga_{0.8}N$, p-type GaN film 17 including Mg as a p-type impurity, undoped GaN film 19, and undoped AlGaN film 21 made of undoped $Al_{0.2}Ga_{0.8}N$ are sequentially formed above first main surface 12a of substrate 12. It should be noted that n-type GaN film 13, undoped AlGaN film 15, p-type GaN film 17, undoped GaN film 19, and undoped AlGaN film 21 are patterned into predetermined shapes to form drift layer 14, first underlayer 16, second underlayer 18, third underlayer 20, and fourth underlayer 22 in FIG. 2.

The layers have thicknesses and carrier concentrations as described below, for example. N-type GaN film 13 has a thickness of 8 μm and a carrier concentration of $1\times10^{16}$ $cm^{-3}$. Undoped AlGaN film 15 has a thickness of 20 nm. P-type GaN film 17 has a thickness of 400 nm and a carrier concentration of $1\times10^{17}$ $cm^{-3}$. Undoped GaN film 19 has a thickness of 200 nm. Undoped AlGaN film 21 has a thickness of 20 nm. It should be noted that the above numerical values are mere examples.

Figure 3B:
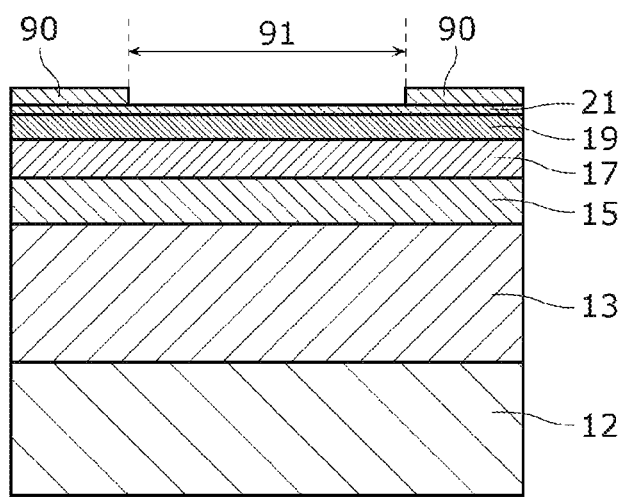
FIG. 3B is a cross-sectional view illustrating a resist patterning process in the method of fabricating the nitride semiconductor device according to Embodiment 1.

Next, as illustrated in FIG. 3B, a resist is applied to the top of undoped AlGaN film 21, and the applied resist is patterned by photolithography to form resist mask 90. Resist mask 90 is used to form gate opening 24 and has opening 91 corresponding to the plan-view shape of gate opening 24.

Figure 3C:
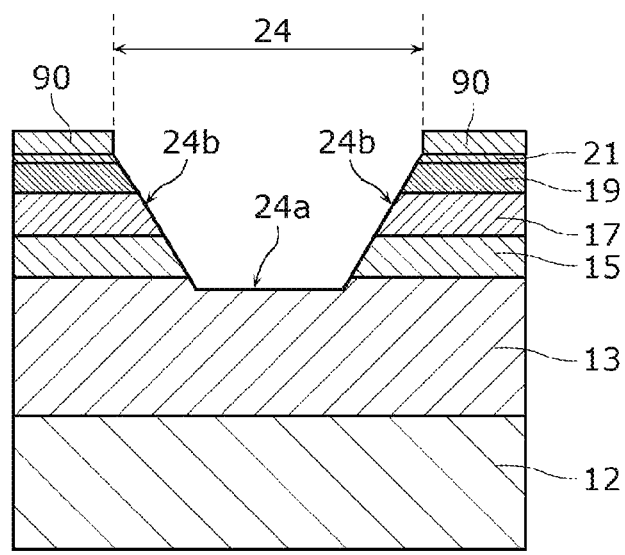
FIG. 3C is a cross-sectional view illustrating a process of forming a gate opening in the method of fabricating the nitride semiconductor device according to Embodiment 1.

Then, as illustrated in FIG. 3C, gate opening 24 is formed by dry etching. Gate opening 24 passes through undoped AlGaN film 21, undoped GaN film 19, p-type GaN film 17, and undoped AlGaN film 15, and n-type GaN film 13 is exposed. Here, bottom 24a of gate opening 24 is parallel to first main surface 12a of substrate 12. Side wall 24b of gate opening 24 is inclined at a predetermined inclination angle with respect to bottom 24a. The inclination angle falls within, for example, the range of 20 degrees to 80 degrees. Thus, the regrowth layers each having a uniform thickness can be formed along side wall 24b, which can suppress the channel from narrowing and thus suppress both a decrease in the carrier concentration and an increase in the on-resistance.

Figure 3D:
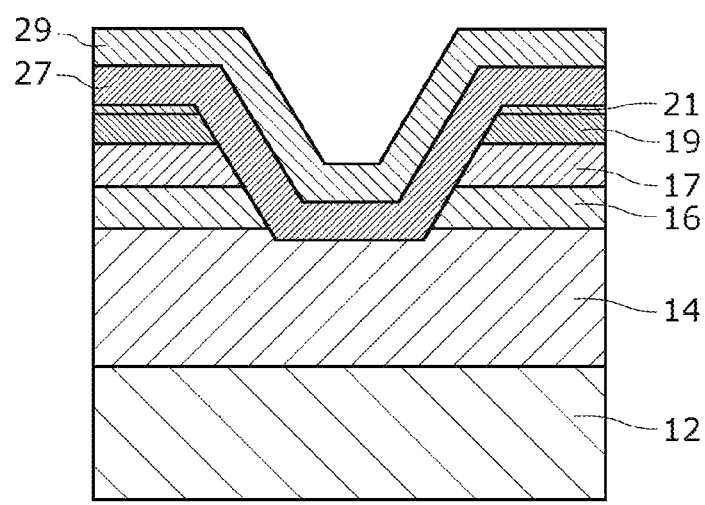
FIG. 3D is a cross-sectional view illustrating a process of regrowing nitride semiconductors in the method of fabricating the nitride semiconductor device according to Embodiment 1.

After removing resist mask 90, as illustrated in FIG. 3D, undoped GaN film 27, an undoped AlN film (not illustrated), and undoped AlGaN film 29 are sequentially formed along the entire inner surface of gate opening 24 by MOVPE. Undoped GaN film 27 and undoped AlGaN film 29 are patterned into predetermined shapes to form electron transport layer 28 and electron supply layer 30.

Each layer has an approximately uniform thickness, and the layers have thicknesses as described below, for example. Undoped GaN film 27 has a thickness of 100 nm. The undoped AlN film has a thickness of 1 nm. Undoped AlGaN film 29 has a thickness of 50 nm. It should be noted that the above numerical values are mere examples.

Figure 3E:
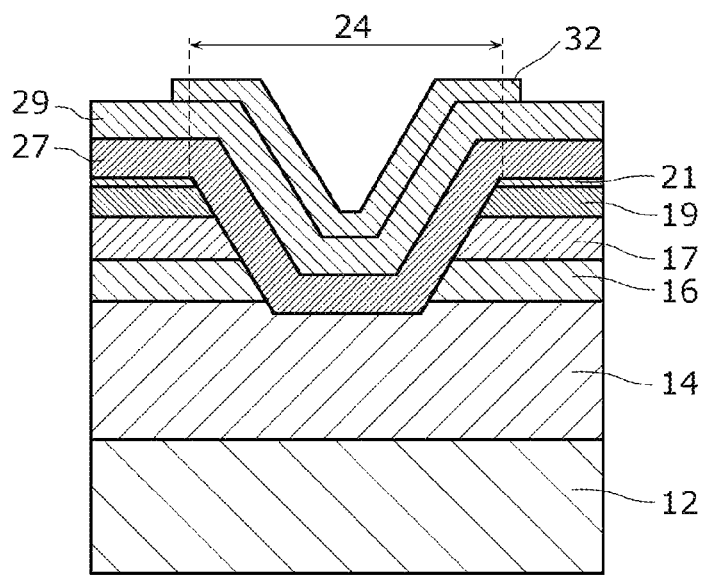
FIG. 3E is a cross-sectional view illustrating a process of forming a gate electrode in the method of fabricating the nitride semiconductor device according to Embodiment 1.

Then, a gate metal film made of Pd is formed by, for example, vapor deposition or sputtering so as to cover gate opening 24. As illustrated in FIG. 3E, gate electrode 32 is formed by patterning the formed gate metal film.

Figure 3F:
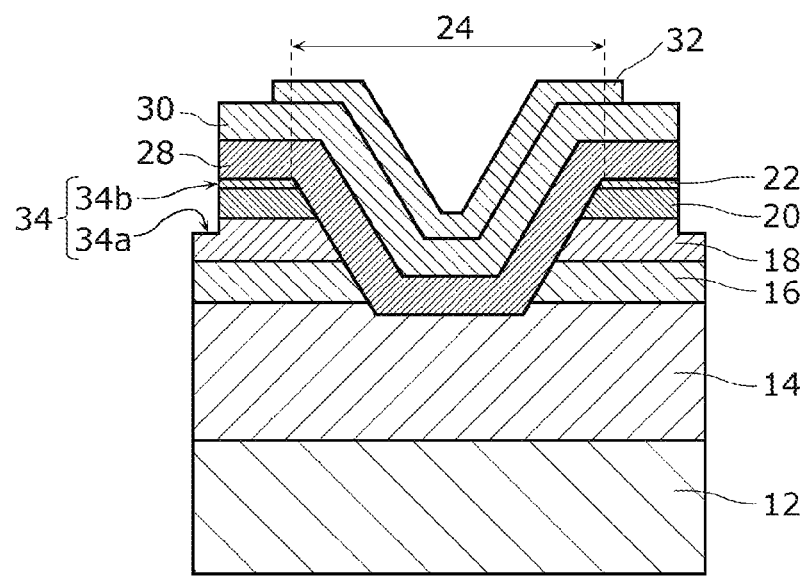
FIG. 3F is a cross-sectional view illustrating a process of forming a source opening in the method of fabricating the nitride semiconductor device according to Embodiment 1.

Finally, as illustrated in FIG. 3F, source opening 34 is formed so as to be apart from gate electrode 32, pass through undoped AlGaN film 29, the undoped AlN film (not illustrated), undoped GaN film 27, undoped AlGaN film 21, and undoped GaN film 19, and reach p-type GaN film 17. As with gate opening 24, source opening 34 is formed by photolithography and dry etching. Undoped AlGaN film 29, undoped GaN film 27, undoped AlGaN film 21, and undoped GaN film 19, and p-type GaN film 17 are patterned to form electron supply layer 30, electron transport layer 28, fourth underlayer 22, third underlayer 20, and second underlayer 18.

A source metal film made of Ti and Au is formed by, for example, vapor deposition or sputtering so as to fill source opening 34. Source electrode 36 is formed by patterning the source metal film. In addition, a drain metal film made of Ti and Al is formed on second main surface 12b of substrate 12 by, for example, vapor deposition or sputtering. Drain electrode 38 is formed by patterning the drain metal film as necessary.

Through the processes, nitride semiconductor device 10 in FIG. 2 is formed.

It should be noted that after forming gate electrode 32 and source electrode 36, an insulating film is formed. Then, contact holes for exposing a portion of each of source electrodes 36 and a portion of gate electrode 32 are formed in the insulating film. Then, a metal film is formed and patterned to form gate electrode pad 40 and source electrode pad 42.

[Variations]

Here, variations of nitride semiconductor device 10 according to Embodiment 1 are described.

[Variation 1]

Figure 4:
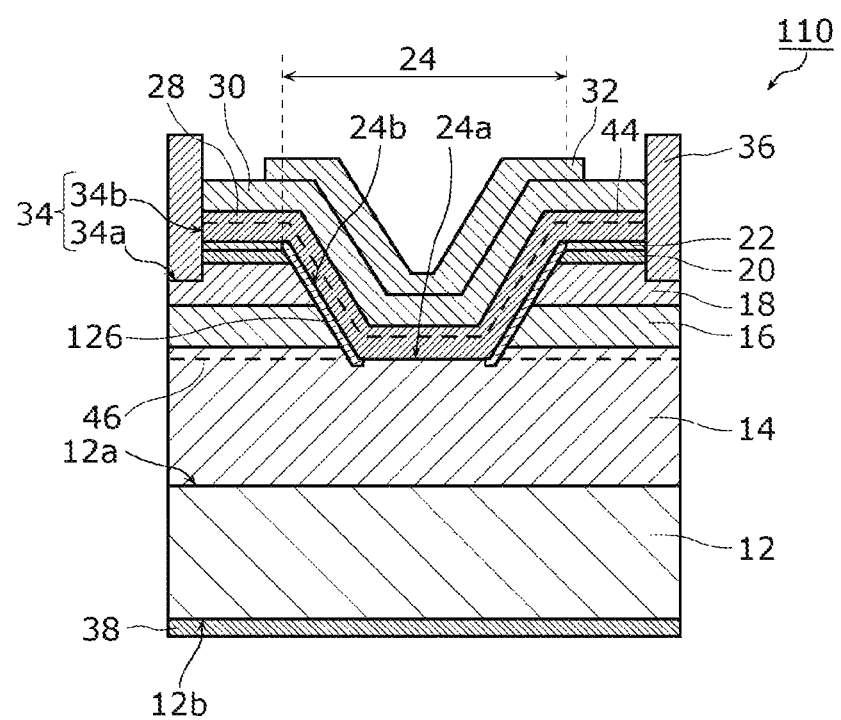
FIG. 4 is a cross-sectional view of a nitride semiconductor device according to Variation 1.

FIG. 4 is a cross-sectional view of nitride semiconductor device 110 according to Variation 1. As illustrated in FIG. 4, nitride semiconductor device 110 includes high-resistance layer 126. In this respect, nitride semiconductor device 110 differs from nitride semiconductor device 10 in FIG. 2. Hereinafter, the descriptions below focus on differences from Embodiment 1, and explanations for common features are omitted or simplified.

High-resistance layer 126 is formed between second underlayer 18 and electron transport layer 28 in gate opening 24. In Variation 1, high-resistance layer 126 is also formed between first underlayer 16 and electron transport layer 28. Specifically, high-resistance layer 126 is formed along side wall 24b and a portion of bottom 24a of gate opening 24. More specifically, high-resistance layer 126 covers the entire surface of side wall 24b by extending from an upper end portion of gate opening 24, that is, a portion of the top surface of fourth underlayer 22, to the portion of bottom 24a. That is, high-resistance layer 126 is formed between electron transport layer 28 and each of first underlayer 16, second underlayer 18, third underlayer 20, and fourth underlayer 22.

For instance, as illustrated in FIG. 4, the top surface of an upper end portion of high-resistance layer 126 is flush with the top surface of fourth underlayer 22. In addition, the top surface of a lower end portion of high-resistance layer 126 is flush with the portion of the top surface of drift layer 14 that forms bottom 24a. High-resistance layer 126 is formed so as to be embedded in a portion including a portion of the top surface of fourth underlayer 22, a portion including an end face of fourth underlayer 22, a portion including an end face of third underlayer 20, a portion including an end face of second underlayer 18, a portion including an end face of first underlayer 16, and a portion including a portion of the top surface of drift layer 14.

High-resistance layer 126 has a higher resistance value than second underlayer 18. In Variation 1, high-resistance layer 126 has a higher resistance value than third underlayer 20.

High-resistance layer 126 is made of a nitride semiconductor. In Variation 1, high-resistance layer 126 includes iron (Fe). High-resistance layer 126 is made of, for example, GaN doped with iron and having a high resistance. High-resistance layer 126 has a thickness of, for example, 50 nm.

Figure 5A:
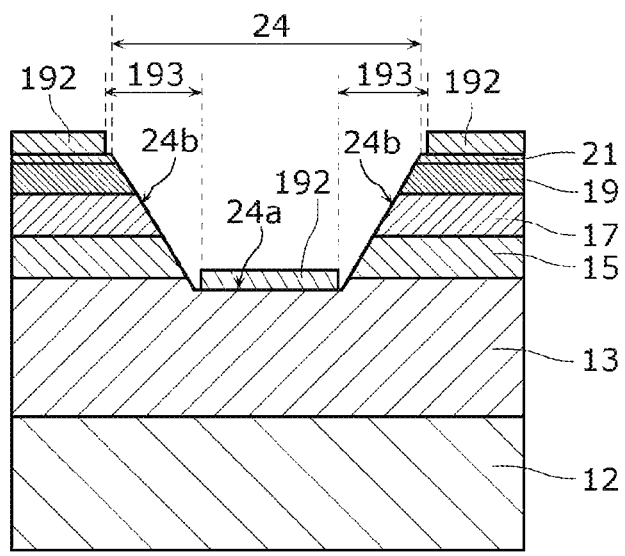
FIG. 5A is a cross-sectional view illustrating a process of patterning a resist to be used as a mask for ion implantation in the method of fabricating the nitride semiconductor device according to Variation 1.
Figure 5B:
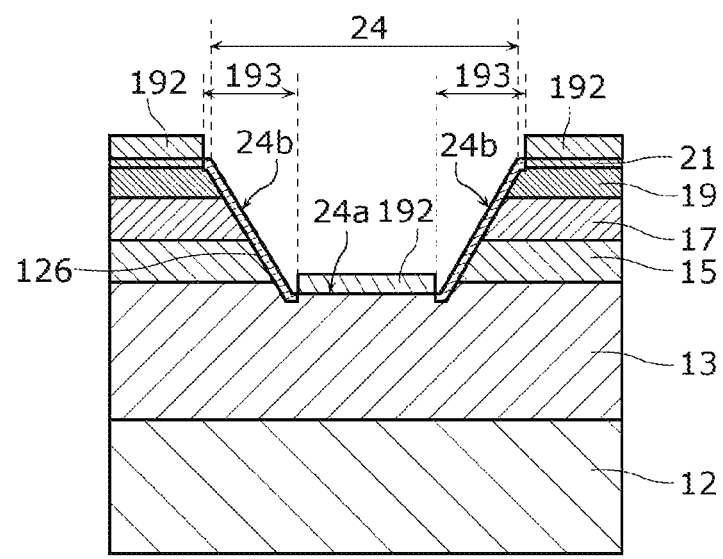
FIG. 5B is a cross-sectional view illustrating an ion implantation process in the method of fabricating the nitride semiconductor device according to Variation 1.

Here, a method of fabricating nitride semiconductor device 110 according to Variation 1 is described with reference to FIGS. 5A and 5B. FIGS. 5A and 5B are cross-sectional views illustrating a method of fabricating nitride semiconductor device 110 according to Variation 1.

Until gate opening 24 is formed, the method of fabricating nitride semiconductor device 110 according to Variation 1 is similar to the method of fabricating nitride semiconductor device 10 according to Embodiment 1. After forming gate opening 24 in FIG. 3C, resist mask 90 is removed. Then, a resist is applied again to the top of undoped AlGaN film 21 and the inside of gate opening 24. As illustrated in FIG. 5A, resist mask 192 is formed by patterning the applied resist by photolithography.

Resist mask 192 is used to form high-resistance layer 126. Resist mask 192 has opening 193 larger than side wall 24b of gate opening 24. Opening 193 extends from a portion of the top surface of undoped AlGaN film 21 and the upper end of side wall 24b to a portion of bottom 24a. Thus, in plan view, at least entire side wall 24b is exposed.

By implanting iron ions into the portion exposed to opening 193 of resist mask 192, high-resistance layer 126 is formed as illustrated in FIG. 5B. High-resistance layer 126 is formed by doping, with iron, the portions, which are exposed to opening 193, of undoped AlGaN film 21, undoped GaN film 19, p-type GaN film 17, and undoped AlGaN film 15, and n-type GaN film 13. It should be noted that the portion of n-type GaN film 13 except for high-resistance layer 126 becomes drift layer 14.

Ion implantation conditions are, for example, an acceleration energy of 40 keV and a dose amount of $1\times10^{14}$ cm$^{-2}$. Thus, high-resistance layer 126 having a thickness of around 50 nm is formed. The iron ion implanted region, that is, high-resistance layer 126 is brought into an amorphous state because of the breakdown of a crystal structure, which enables high-resistance layer 126 to have a high resistance.

At that time, instead of the iron ions, metal ions having a large atomic number, such as titanium ions, chromium ions, copper ions, or nickel ions, may be used. This can suppress re-crystallization of high-resistance layer 126 due to heat treatment performed in a subsequent process, which enables high-resistance layer 126 to have a high resistance value.

The processes after high-resistance layer 126 is formed are similar to those in the method of fabricating nitride semiconductor device 10 according to Embodiment 1. Specifically, after forming high-resistance layer 126, as illustrated in FIG. 3D, undoped GaN film 27, an undoped AlN film (not illustrated), and undoped AlGaN film 29 are sequentially formed by the regrowth process. It should be noted that since high-resistance layer 126 is made of a nitride semiconductor, it is possible to improve the film quality of each of undoped GaN film 27, the undoped AlN film (not illustrated), and undoped AlGaN film 29 formed by the regrowth process.

As described above, in Variation 1, high-resistance layer 126 is formed between electron transport layer 28 and second underlayer 18. Thus, it is possible to suppress a leakage current from flowing from source electrode 36 to gate electrode 32 through second underlayer 18 and electron transport layer 28. Accordingly, in Variation 1, it is possible to provide nitride semiconductor device 110 in which a leakage current is suppressed.

It should be noted that resist mask 192 may be formed so that opening 193 exposes only the end face of p-type GaN film 17 along side wall 24b. That is, the plan-view shape of opening 193 may be formed by the boundary between p-type GaN film 17 and undoped GaN film 19 and the boundary between p-type GaN film 17 and undoped AlGaN film 15. Alternatively, resist mask 192 may be formed so that opening 193 exposes the entire end face of p-type GaN film 17 and the entire end face of undoped AlGaN film 15 along side wall 24b. Since opening 193 exposes the entire end face of p-type GaN film 17 along side wall 24b, high-resistance layer 126 can be formed so as to certainly cover the portion of p-type GaN film 17 exposed to side wall 24b.

[Variation 2]

Figure 6:
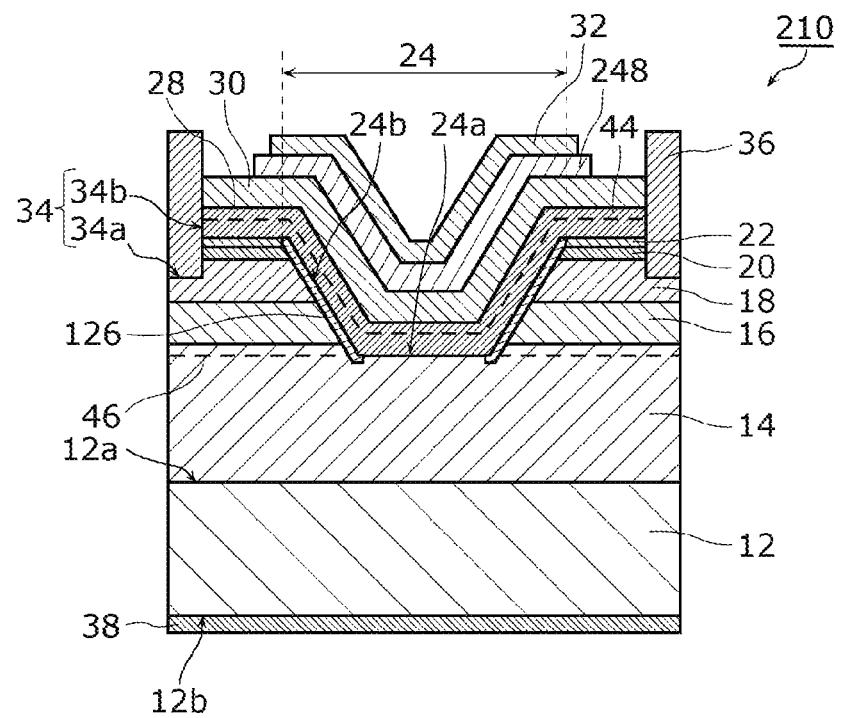
FIG. 6 is a cross-sectional view of a nitride semiconductor device according to Variation 2.

FIG. 6 is a cross-sectional view of nitride semiconductor device 210 according to Variation 2. As illustrated in FIG. 6, nitride semiconductor device 210 includes threshold control layer 248. In this respect, nitride semiconductor device 210 differs from nitride semiconductor device 10 in FIG. 2. The descriptions below focus on differences from Embodiment 1, and explanations for common features are omitted or simplified.

Threshold control layer 248 is an example of a second nitride semiconductor layer formed between gate electrode 32 and electron transport layer 28 and having the second conductivity type. Threshold control layer 248 is formed on electron supply layer 30 and is in contact with electron supply layer 30 and gate electrode 32.

In Variation 2, when substrate 12 is seen in plan view, the end of threshold control layer 248 is closer to source electrode 36 than the end of gate electrode 32 is. Threshold control layer 248 and source electrode 36 are apart from each other and not in contact with each other.

For instance, threshold control layer 248 is a p-type $Al_{0.2}Ga_{0.8}N$ nitride semiconductor layer having a thickness of 100 nm and a carrier concentration of $1 \times 10^{17}$ $cm^{-3}$. After undoped AlGaN film 29 to be electron supply layer 30 is formed, a nitride semiconductor layer is formed also by MOVPE and patterned to form threshold control layer 248.

In Variation 2, the potential of the conduction band end of a channel is increased because of threshold control layer 248, which enables nitride semiconductor device 210 to have a high threshold voltage. Accordingly, nitride semiconductor device 210 can be used as a normally-off FET.

It should be noted that threshold control layer 248 may include an insulation material. That is, threshold control layer 248 may be an insulation layer.

Embodiment 2

Hereinafter, Embodiment 2 is described. In Embodiment 2, a first electron transport layer includes two layers. In this respect, Embodiment 2 differs from Embodiment 1. The descriptions below focus on differences from Embodiment 1, and explanations for common features are omitted or simplified.

Figure 7:
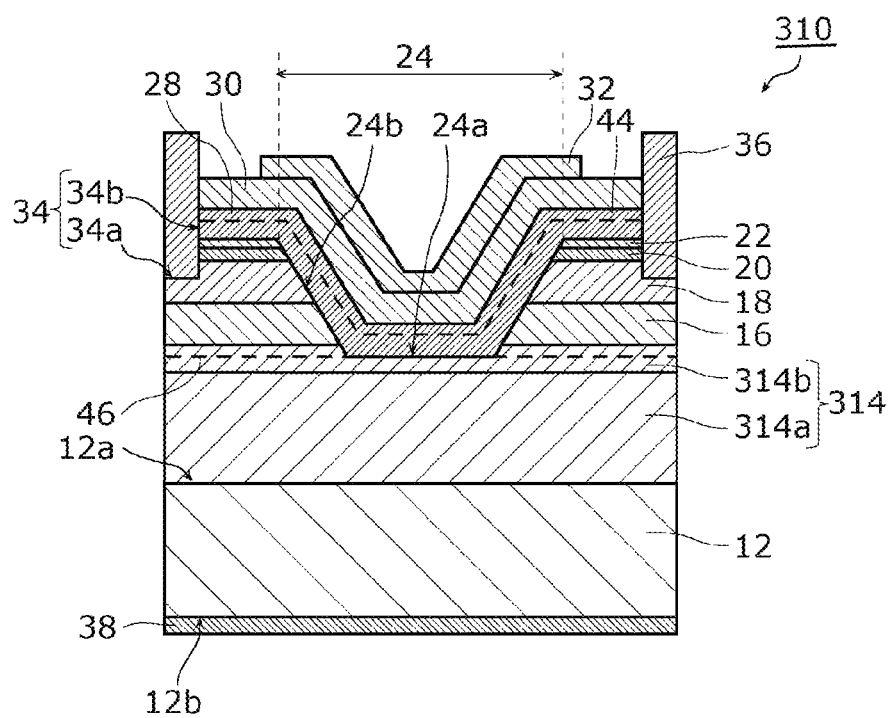
FIG. 7 is a cross-sectional view of a nitride semiconductor device according to Embodiment 2.

FIG. 7 is a cross-sectional view of nitride semiconductor device 310 according to Embodiment 2. As illustrated in FIG. 7, nitride semiconductor device 310 includes electron transport layer 314 instead of drift layer 14. In this respect, nitride semiconductor device 310 differs from nitride semiconductor device 10 in FIG. 2.

Electron transport layer 314 is an example of a first electron transport layer. Electron transport layer 314 includes drift layer 314a and undoped nitride semiconductor layer 314b.

Drift layer 314a is an example of a third nitride semiconductor layer having a first conductivity type and approximately the same as drift layer 14 according to Embodiment 1. In Embodiment 2, gate opening 24 does not reach drift layer 314a. Only in this respect, drift layer 314a differs from drift layer 14 according to Embodiment 1. Thus, drift layer 314a has a flat top surface.

Undoped nitride semiconductor layer 314b is an example of a fourth nitride semiconductor layer that is undoped and positioned between drift layer 314a and first underlayer 16. Specifically, undoped nitride semiconductor layer 314b is an undoped GaN film. For instance, undoped nitride semiconductor layer 314b has a film thickness of 200 nm. However, the film thickness is not limited to the above example.

Undoped nitride semiconductor layer 314b is in contact with first underlayer 16, and an AlGaN/GaN heterointerface is formed between undoped nitride semiconductor layer 314b and first underlayer 16. Thus, two-dimensional electron gas 46 is generated in undoped nitride semiconductor layer 314b.

Drift layer 314a and undoped nitride semiconductor layer 314b are formed by, for example, the following method. Specifically, as in the fabrication process illustrated in FIG. 3A, after forming n-type GaN film 13 and before forming undoped AlGaN film 15, an undoped GaN film is formed. Then, in the fabrication process illustrated in FIG. 3C, gate opening 24 is formed so as to expose the undoped GaN film. Thus, in Embodiment 2, bottom 24a of gate opening 24 forms a portion of the top surface of undoped nitride semiconductor layer 314b.

In Embodiment 2, electrons spread horizontally because of two-dimensional electron gas 46 generated in undoped nitride semiconductor layer 314b. This, as with Embodiment 1, facilitates a current between source and drain electrodes to spread in a large portion of drift layer 314a. In addition, undoped nitride semiconductor layer 314b has few impurities, which can increase the electron mobility. Accordingly, higher speed operation of nitride semiconductor device 310 is achieved.

Embodiment 3

Hereinafter, Embodiment 3 is described. In Embodiment 3, a first electron transport layer includes two layers, and a first electron supply layer is not included. In these respects, Embodiment 3 differs from Embodiment 1. The descriptions below focus on differences from Embodiment 1, and explanations for common features are omitted or simplified.

Figure 8:
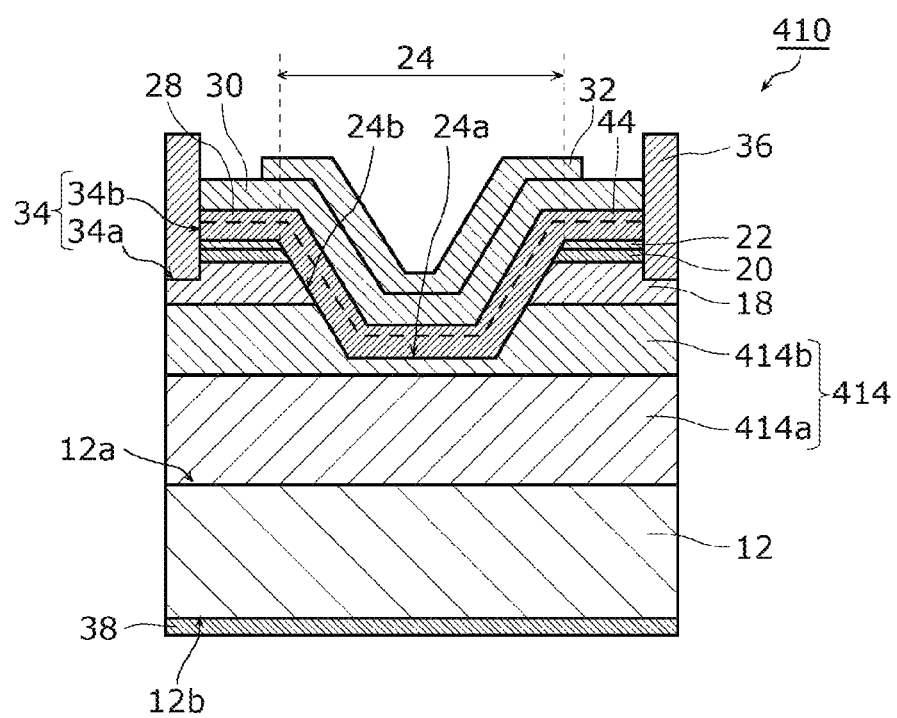
FIG. 8 is a cross-sectional view of a nitride semiconductor device according to Embodiment 3.

FIG. 8 is a cross-sectional view of nitride semiconductor device 410 according to Embodiment 3. As illustrated in FIG. 8, nitride semiconductor device 410 includes electron transport layer 414 instead of drift layer 14. In this respect, nitride semiconductor device 410 differs from nitride semiconductor device 10 in FIG. 2. In addition, nitride semiconductor device 410 does not include first underlayer 16.

Electron transport layer 414 is an example of a first electron transport layer. Electron transport layer 414 includes low-concentration layer 414a and high-concentration layer 414b.

Low-concentration layer 414a is an example of a third nitride semiconductor layer having a first conductivity type and is approximately the same as drift layer 14 according to Embodiment 1. In Embodiment 3, gate opening 24 does not reach low-concentration layer 414a. In this respect, low-concentration layer 414a differs from drift layer 14 according to Embodiment 1. Thus, low-concentration layer 414a has a flat top surface.

High-concentration layer 414b is an example of a fourth nitride semiconductor layer positioned between low-concentration layer 414a and second underlayer 18 and having a higher impurity concentration than low-concentration layer 414a. Specifically, high-concentration layer 414b is an n-type GaN film having a higher n-type-impurity concentration than low-concentration layer 414a. For instance, high-concentration layer 414b has a carrier concentration higher than or equal to $1 \times 10^{18}$ cm$^{-3}$. However, the carrier concentration is not limited to the above example. High-concentration layer 414b is thinner than low-concentration layer 414a and has a film thickness of less than 1 μm. However, the film thickness is not limited to the above example. By making low-concentration layer 414a thicker than high-concentration layer 414b, it is possible to increase the dielectric strength of the nitride semiconductor device.

High-concentration layer 414b is in contact with second underlayer 18. In Embodiment 3, there are small band gap differences between low-concentration layer 414a, high-concentration layer 414b, and second underlayer 18. Thus, no heterointerface is formed. That is, two-dimensional electron gas 46 in FIG. 2 and other figures is not generated.

Although two-dimensional electron gas 46 is not generated, because of having a high n-type-impurity concentration, high-concentration layer 414b has a low resistance. Thus, electrons spread horizontally within high-concentration layer 414b. This, as with Embodiment 1, facilitates a current between source and drain electrodes to spread in large portions of high-concentration layer 414b and low-concentration layer 414a.

Low-concentration layer 414a and high-concentration layer 414b are formed by, for example, the following method. Specifically, in the fabrication process illustrated in FIG. 3A, after forming n-type GaN film 13 and before forming undoped AlGaN film 15, an n-type GaN film having a higher impurity concentration than n-type GaN film 13 is formed. Then, in the fabrication process illustrated in FIG. 3C, gate opening 24 is formed so as to expose the n-type GaN film having a high impurity concentration. Thus, in Embodiment 3, bottom 24a of gate opening 24 forms a portion of the top surface of high-concentration layer 414b.

In Embodiment 3, since high-concentration layer 414b has a low resistance, electrons are likely to spread horizontally. This, as with Embodiment 1, facilitates a current between the source and drain electrodes to spread in a large portion of electron transport layer 414. Accordingly, the resistance value during operation can be further decreased.

Other Embodiment

The nitride semiconductor device(s) according to one or more than one aspect is described above on the basis of the embodiments. However, the present disclosure is not limited to the descriptions in the above embodiments. The present disclosure includes, within the scope of the present disclosure, one or more embodiments obtained by making various changes envisioned by those skilled in the art to the above embodiment(s) and one or more embodiments obtained by combining structural elements included in different embodiments.

For instance, in the above embodiments, the first conductivity type is the n-type, and the second conductivity type is the p-type. However, this is not the only example. The first conductivity type may be the p-type, and the second conductivity type may be the n-type.

For instance, high-resistance layer 126 may be formed only between electron transport layer 28 and second underlayer 18. For instance, high-resistance layer 126 may be formed along only a portion of side wall 24b of gate opening 24 and does not have to cover the end faces of first underlayer 16, third underlayer 20, and fourth underlayer 22.

For instance, in plan view, the end of gate electrode 32 may be identical to the end of gate opening 24. Alternatively, in plan view, gate electrode 32 may be formed inside gate opening 24.

In the above embodiments, for instance, source opening 34 reaches second underlayer 18. However, this is not the only example. For instance, source opening 34 may reach electron transport layer 28, and source electrode 36 may be connected to electron transport layer 28 but does not have to be connected to second underlayer 18.

For instance, drift layer 14, which is an example of the first electron transport layer, may have the same composition as electron transport layer 28, which is an example of the second electron transport layer. Alternatively, drift layer 14 may have a higher carbon concentration than electron transport layer 28. For instance, drift layer 14 may have a carbon concentration of $10^{18}$ cm$^{-3}$ order of magnitude, and electron transport layer 28 may have a carbon concentration of $10^{16}$ cm$^{-3}$ order of magnitude. By increasing the carbon concentration of drift layer 14, it is possible to increase the dielectric strength of nitride semiconductor device 10.

In addition, the carbon concentration within drift layer 14 does not have to be uniform. For instance, the carbon concentration may be low in a portion including the top surface of drift layer 14, that is, near the interface between drift layer 14 and first underlayer 16. This can facilitate the generation of two-dimensional electron gas 46 and increase the channel mobility, which can facilitate the spread of a current.

For instance, the plan layouts of the nitride semiconductor devices are not limited to the example illustrated in FIG. 1. For instance, the plan-view shape of source electrode 36 may be a rectangle extending in one direction. Source electrodes 36 may be arranged in a transverse direction. In this case, the transverse direction corresponds to the direction along the line II-II.

In addition, for instance, various changes, replacement, addition, and omission are possible in the above embodiments within the scope of the claims and equivalents thereof.

INDUSTRIAL APPLICABILITY

The present disclosure can be used as a nitride semiconductor device having a low resistance value and used in, for example, a power transistor for use in, for example, the power supply circuit of consumer equipment, such as a television.

The invention claimed is:

1. A nitride semiconductor device comprising:
   a substrate having a first main surface and a second main surface opposite to the first main surface;
   a first electron transport layer disposed above the first main surface and having a first conductivity type;
   a first electron supply layer above the first electron transport layer;
   a first nitride semiconductor layer disposed above the first electron supply layer and having a second conductivity type different from the first conductivity type;
   a second electron transport layer disposed above the first nitride semiconductor layer and along an inner surface of a first opening passing through the first nitride semiconductor layer and the first electron supply layer and reaching the first electron transport layer; and
   a second electron supply layer disposed above the second electron transport layer and covering the first opening.

2. The nitride semiconductor device according to claim 1, further comprising:
   a high-resistance layer disposed along a portion of the inner surface of the first opening, between the first nitride semiconductor layer and the second electron transport layer, including a nitride semiconductor, and having a resistance higher than a resistance of the first nitride semiconductor layer.

3. The nitride semiconductor device according to claim 2, wherein the high-resistance layer includes iron.

4. The nitride semiconductor device according to claim 2, wherein the high-resistance layer is disposed along a portion of the inner surface of the first opening, between the first electron supply layer and the second electron transport layer.

5. The nitride semiconductor device according to claim 1, further comprising:
   a gate electrode disposed above the second electron supply layer and covering the first opening; and
   a second nitride semiconductor layer disposed between the gate electrode and the second electron supply layer and having the second conductivity type.

6. The nitride semiconductor device according to claim 1, further comprising:
   a source electrode connected to the first nitride semiconductor layer and the second electron transport layer,
   wherein when the substrate is seen in plan view, an end of the gate electrode is closer to the source electrode than an end of the first opening is.

7. The nitride semiconductor device according to claim 6, wherein at least a portion of the source electrode is inside a second opening positioned apart from the gate electrode, passing through the second electron transport layer, and reaching the first nitride semiconductor layer.

8. The nitride semiconductor device according to claim 1, wherein the first electron transport layer includes:
   a third nitride semiconductor layer having the first conductivity type; and
   a fourth nitride semiconductor layer that is undoped and positioned between the third nitride semiconductor layer and the first electron supply layer.

9. A nitride semiconductor device comprising:
   a substrate having a first main surface and a second main surface opposite to the first main surface;
   a first electron transport layer disposed above the first main surface and having a first conductivity type;
   a first nitride semiconductor layer disposed above the first electron transport layer and having a second conductivity type different from the first conductivity type;
   a second electron transport layer disposed above the first nitride semiconductor layer and along an inner surface of a first opening passing through the first nitride semiconductor layer and reaching the first electron transport layer; and
   an electron supply layer disposed above the second electron transport layer and covering the first opening,
   wherein the first electron transport layer includes:
   a third nitride semiconductor layer having the first conductivity type; and
   a fourth nitride semiconductor layer positioned between the third nitride semiconductor layer and the first nitride semiconductor layer and having an impurity concentration higher than an impurity concentration of the third nitride semiconductor layer, the fourth nitride semiconductor layer having the first conductivity type.

* * * * *